United States Patent [19]
Marten et al.

[11] Patent Number: 4,467,276

[45] Date of Patent: Aug. 21, 1984

[54] ARRANGEMENT FOR EVALUATING AN OPTICAL BEAM

[75] Inventors: Peter Marten, Blaustein; Edgar Weidel, Senden, both of Fed. Rep. of Germany

[73] Assignee: Licentia Patent-Verwaltungs-GmbH, Fed. Rep. of Germany

[21] Appl. No.: 366,209

[22] Filed: Apr. 7, 1982

[30] Foreign Application Priority Data

Apr. 10, 1981 [DE] Fed. Rep. of Germany ....... 3114596
Feb. 4, 1982 [DE] Fed. Rep. of Germany ....... 3203679

[51] Int. Cl.³ ............................................ G01R 23/16
[52] U.S. Cl. .............................. 324/77 R; 324/77 K; 350/96.24
[58] Field of Search ................................ 324/77 K, 96; 350/96.24; 340/600

[56] References Cited

U.S. PATENT DOCUMENTS

| | | | |
|---|---|---|---|
| 3,441,724 | 4/1969 | Taylor | 324/77 K |
| 3,541,442 | 11/1970 | Gaston | 324/77 |
| 3,883,803 | 5/1975 | Donald et al. | 324/77 K |
| 3,942,109 | 3/1976 | Crumly | 324/77 K |
| 4,092,059 | 5/1978 | Hawkes | 350/96.24 |

Primary Examiner—Michael J. Tokar
Attorney, Agent, or Firm—McGlew & Tuttle

[57] ABSTRACT

A high-resolution Bragg-cell receiver for monitoring and/or analyzing the frequency of RF signals comprises a lightwave guide arrangement with discrete photodiodes coupled thereto which is substituted for a photodiode array. The guide has closely spaced inlets for light from the Bragg-cell and fanned-out outlets for coupling to the discrete photodiodes.

12 Claims, 3 Drawing Figures

ARRANGEMENT FOR EVALUATING AN OPTICAL BEAM

FIELD AND BACKGROUND OF THE INVENTION

The present invention relates in general to signal evaluating equipment and in particular to a new and useful arrangement for evaluating an optical beam which has passed through a Bragg-cell, in particular a Bragg-cell which has been exposed to radio frequency signals.

An arrangement to evaluate optical beams is known from the article "Bragg-Cell RF-Signal Processing" by Coppock et al, Microwave Journal, September 1978, pages 62–65. In such an arrangement, an RF signal to be analyzed produces sound waves in a Bragg-cell causing the deflection of a light beam passing through the Bragg-cell. Advantageously, a coherent light beam, for example a laser beam, is used. The diffraction patterns produced by the deflected light beam are to be considered as Fourier transforms of the RF signal into the frequency range (frequency range here corresponds to angular range) and are usually evaluated by means of photodetectors, to measure the spectral power density of the RF signal.

With Bragg-cells of high resolution, several hundred points must be evaluated. For this purpose, so-called "photodiode arrays" are usually employed which have a serial display (digital or analog) through connected shift registers. The signals of the photodetectors are available in time sequence (in phase with the shifting cycle of the shift register), i.e. always only a single signal of a photodetector (corresponding to a frequency window of the RF signal) is available. The intensity of the signal (photocurrent of one photodetector) corresponds to the integral $$\int_0^T P_{RF}(t)\, dt$$

wherein $T$=integration interval of the photodetector, and $P_{RF}(t)$ a variation in time of the signal amplitude during the integration interval. The integration interval $T$ of the photodetector may be taken as being about $N.\tau$ with $N$ being the total number of photodetectors, and $\tau$ being the duration of the shifting cycle at the sequential readout. Thus, not the true spectral power of the RF signal, but the integral power within a frequency window is determined corresponding to the angular range covered by a single photodiode. If, as in an RF monitoring reception for example, a plurality of pulse modulated transmitters is concerned, having overlapping spectra and/or pulse repetition rates smaller than the integration interval $T$, neither the power nor the spectrum of the individual transmitters can be inferred from the photocurrent of a single photodiode associated with a definite frequency window.

Another disadvantage is that the limiting sensitivity (minimum detectable RF power or brightness in the angular interval) of photodiode arrays is poor. This is primarily due to the small photoactive areas of the photodiode arrays.

SUMMARY OF THE INVENTION

The present invention is directed to an improved arrangement of the above-mentioned kind, which increases the limiting sensitivity for RF signals and permits the determination of a true spectral power of an RF signal and the evaluation of any frequency windows in any way.

Accordingly an object of the present invention is to provide an arrangement for evaluating an optical beam which can be deflected by means of a Bragg-cell, which comprises a light wave guide having at lease one entrance gate and at least one exit gate, the entrance gate being disposed adjacent the Bragg-cell for receiving light deflected thereby, and the exit gate being optically coupled to at least one photodetector for generating an output, and at least one evaluating unit for receiving and evaluating the photodetector output.

Another object of the invention is to provide such an arrangement wherein the light wave guide includes a plurality of aligned entrance gates which are closely adjacent each other, and a plurality of spaced exit gates each associated with a separate photodetector.

A still further object of the invention is to provide such an arrangement wherein the evaluating unit is provided with at least one alarm device for determining the presence of at least one RF signal, by which the frequency range and/or channel number of at least one RF signal which has been applied to the Bragg-cell, is determined.

A still further object of the invention is to provide an arrangement for evaluating an optical beam which can be deflected by means of a Bragg-cell, which is simply in design, rugged in construction and econimical to manufacture.

A primary advantage of the invention is that the electrical output signals produced by the photodetectors can be evaluated in any way, for example through a data processing device. It is possible, for example, to simultaneously monitor a plurality of frequency windows, in a so-called "multiple reading mode", and/or to monitor any of the frequency windows, in a so-called "random addressing mode". The "random addressing mode" makes it possible, for example, to monitor only certain, particularly important frequency windows at a monitoring rate which is higher than that obtainable with a time-sequential, cyclic operation by means of a photodiode array.

Another advantage of the invention is that photodetectors may be employed which are best suitable electrically and/or optically, while their geometry and/or mechanical structure can almost be neglected.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
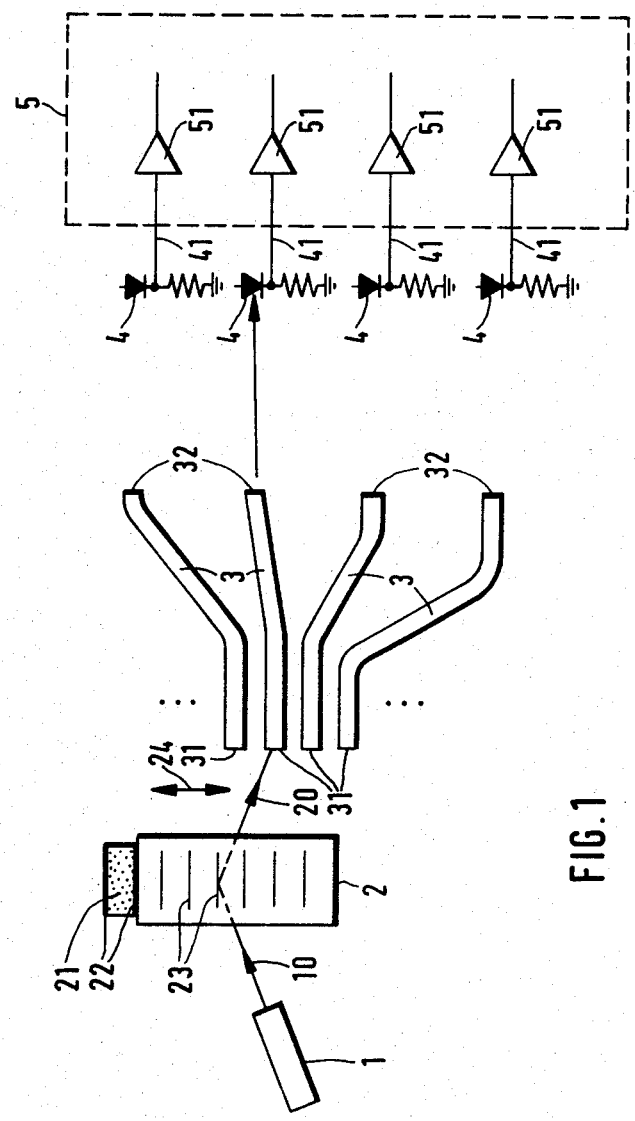
FIG. 1 is a schematic representation of one embodiment of the invention.

Referring to the drawings in particular, the invention embodied therein comprises an arrangement for evaluating an optical beam which can be deflected by means of a Bragg-cell which includes a light wave guide for conveying the deflected light beam from the Bragg-cell to one of a plurality of photodetectors, and an evaluating unit 5 for evaluating signals from the photodetectors.

As shown in FIG. 1, an optical beam 10, preferably a coherent light beam, issuing from a light source 1, preferably a laser, falls on a Bragg-cell 2, for example a crystal, to which an electromechanical transducer 21 provided with electrical leads 22 is coupled. If now an electric signal, such as an RF signal to be monitored, is supplied through leads 22 to transducer 21, which is a piezoelectric ceramic element for example, acoustic oscillations are excited in the Bragg-cell by which the incident beam 10 is deflected (reflected). Since a modulated RF signal is assumed, an optical output beam 20 thus produced moves as indicated by the double arrow 24. The motion of output beam 20 may thus be considered a transformation of the frequency range into the geometric, multi-dimensional space. From the spatial position of output beam 20, for example, frequency variations in time of the exciting RF signal may be inferred.

In accordance with the invention, output beam 20 falls upon at least one of the entrance gates 31 of at least one lightwave guide 3, for example an optical glass fiber. With a proper spatial arrangement of entrance gates 31, for example, along a straight line, and an optically effective cross-section thereof, for example squares or other suitable polygons of as small an area as possible, the spacing between adjacent entrance gates 31 can be minimized to ensure an exact determination of the spatial position of the output beam. From this position and variation in time thereof, the exact frequency or frequency variation of the exciting RF signal can be determined. Further, it is advisable to isolate entrance gates 31 from each other optically, to prevent so-called optical coupling between adjacent lightwave guides 3. The just mentioned arrangement may be obtained, for example, by wrapping the optical fibers having a substantially square and/or rectangular cross-section, in substantially opaque envelopes and connecting them in juxtaposition by means of an adhesive to a so-called flat optical cable. If then, one end of such a flat cable is ground and polished, the desired entrance gates 31 are obtained which may be provided with a reflection-reducing coating for the wavelength of the light used.

The other end of the flat optical cable is fanned out to couple each of exit gates 32 of lightwave guides 3 to at least one photoconductor 4, as shown in the figure. Such an arrangement makes it possible to select photodetectors 4 which are best suitable for the specific application. In the shown example, photodetectors 4 comprise individual (discrete) photodiodes which are electrically connected, by their anodes, to at least one electric current or voltage source (not shown), and by their cathodes, through resistances, to ground. The optical properties (spectral sensitivity, aperture) and electrical parameters (response or follow-up time) of such a photodetector 4 can easily be brought into relation with the properties required for the specific analysis of RF signals. If, for example, rapid frequency variations are to be analyzed, a small time constant $T = R \cdot C$ of photodetector 4 is wanted, with R or C being the values of the electrical resistance or capacitance of photodetector 4.

The electrical outputs 41 of photodetectors 4 are connected to at least one evaluating unit 5 comprising, for example, preamplifiers 51 and pulse shapers (not shown) and an electronic data processor (microprocessor). Such an evaluating unit 5 is very versatile in analyzing electrical output signals of photodetectors 4 and of RF signals to be monitored, and makes it possible, for example, to simultaneously monitor a plurality of frequency windows (multiple reading mode), or to monitor in any way any frequency window (random address mode).

The invention is not limited to the described embodiment. For example, it is within the scope of the invention to couple exit gates 32 to an optical switch (demultiplexer) having a single photodetector 4 applied to its one output, and being switches by the evaluating unit. Further, incident beam 10 may be split into a plurality of light beams which are deflected at a Bragg-cell by means of a plurality of transducers 2. Then, with correspondingly distributed entrance gates 31, a plurality of RF signals can be monitored.

Figure 2:
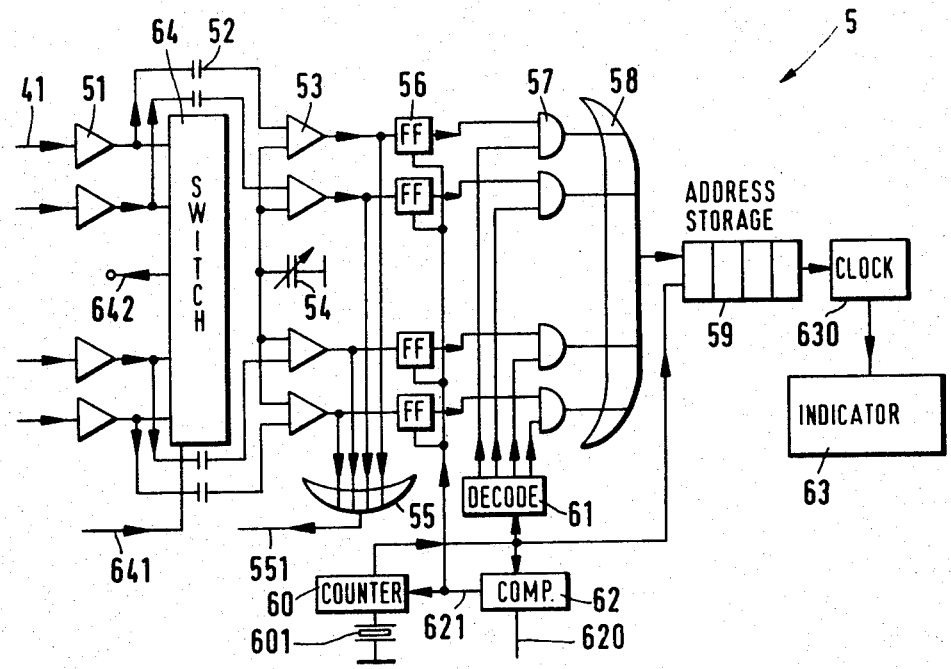
FIG. 2 is a schematic representation of one embodiment of the electronic evaluating unit used in the invention.
Figure 3:
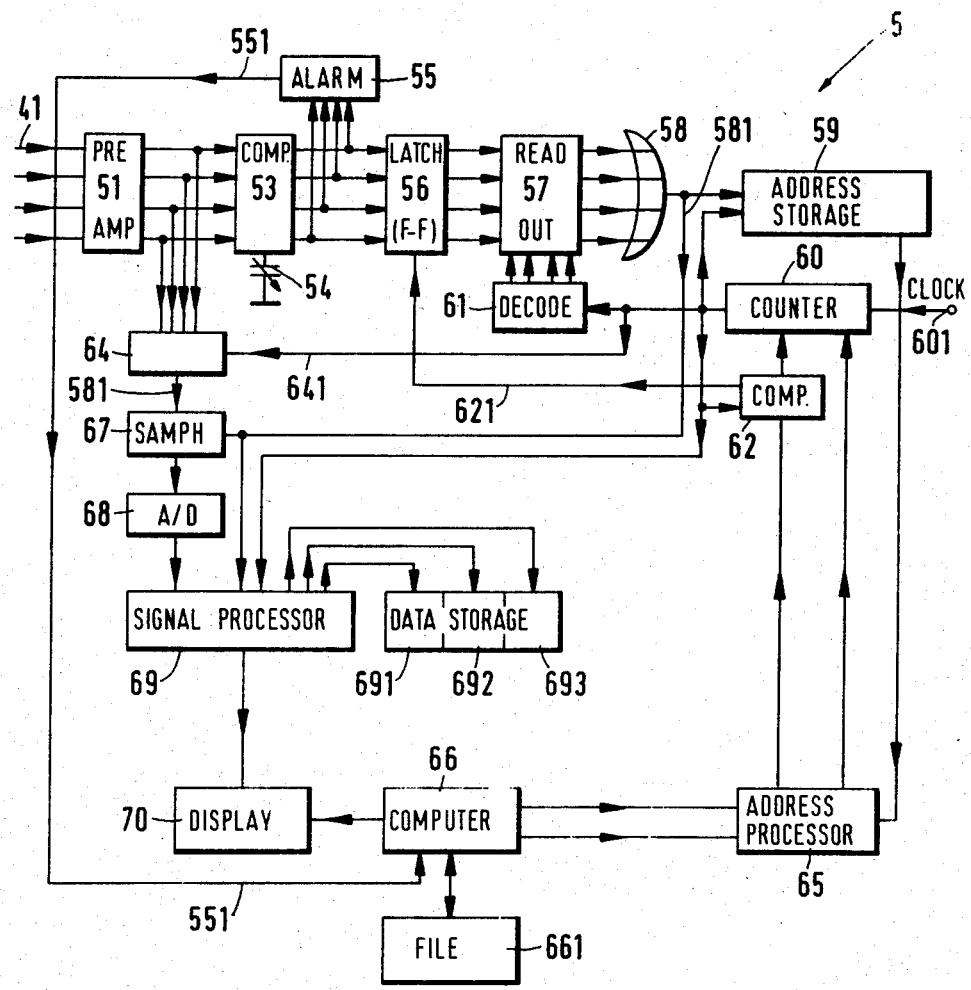
FIG. 3 is a schematic representation of another embodiment of the evaluating unit used in accordance with the invention.

FIGS. 2 and 3 show an embodiment of an electronic evaluating unit according to the invention. For clarity, a unit for evaluating electrical output signals of only four photodetectors is shown as an example. It is possible to enlarge the system to any number of photodetectors. The diagrammatical connecting lines between individual schematically indicated electronic sections relate to the main signal flow only, which is indicated by arrows.

A unit described in the following is advantageously very inexpensive and makes different modes of monitoring the above mentioned RF signals possible at a high speed of evaluation.

In a first exemplary mode of operation, whether an RF signal is present in a given frequency band is to be determined. Then, an RF signal, which is assumed to be present, is to be analyzed, for example as to its frequency and/or variation in time and electric power.

Another exemplary mode of operation is to monitor known RF transmitters and/or RF frequency channels.

FIG. 3 is a schematic of the evaluating unit, the circuitry and operation of which is explained in the following with reference to FIG. 2. Identical reference numerals are used in both figures to represent identical or similar parts.

In FIG. 2 at least one electrical output signal (RF pulses) of a photodetector 4 passes through a preamplifier 51 to a coupling capacitor 52 by which a disturbing DC voltage (DC offset) which might occur is kept away from the following comparators 53. A reference voltage is applied to comparators 53, through an adjustable voltage source 54, which permits the cutting out of RF pulses that fall short of a certain minimum amplitude (sensitivity adjustment). Each RF pulse in any frequency channel, and thus any photodetector 4, produces a voltage pulse at the output of the respective comparator 53, having a selected amplitude such that a following digital signal processing is possible, for example in the so-called ECL technique.

The output signals of all the comparators 53 are supplied to an alarm device 55, for example an OR gate, where a so-called alarm signal is produced at the output, i.e. in an alarm line 551, at the instant when, during the involved period of time, at least one RF pulse has occurred in the frequency band $B = N \cdot \Delta f$, wherein $\Delta f$ is the equivalent bandwidth of an individual channel, and N is the number of individual channels, i.e. four in the present example. To test the frequency band B exactly, it is not sufficient to ascertain that at least one RF pulse occurred. The respective channel numbers must also be determined. This is done by applying the N outputs of comparators 53 to the N inputs of latches 56, for example flip-flops. An n-digit binary information is thus obtained at the N outputs of latches 56, indicating in which individual channel an RF signal occurred, for example "1" means at least one RF pulse in the considered individual channel, "0" means no pulse in this channel.

The binary information is read out through a readout device 57, for example N AND gates having their outputs interconnected through a common OR gate 58. At the output of OR gate 58, a store instruction appears for a high speed address storage 59. In a binary channel counter 60, an address is continually produced which also is supplied to address storage 59 and stored therein as soon as a store instruction arrives. The output of binary channel counter 60 is further applied to binary-to-decimal decoder 61 producing all numbers within the range of 1 to N in ascending order until, upon reaching a maximum number N, it is reset by a binary comparator 62. The N outputs of binary-to-decimal decoder 61 are applied to the AND gates of readout device 57 where an interconnection with latches 56 is affected. Upon an accomplished storage, binary comparator 62 produces in addition a reset pulse which is transmitted through a reset line 621 to channel counter 60 and latches 56, so that a new address can be stored. A clock 601 produces the timing pulses for channel counter 60. A connection line 620 serves the purpose of setting the maximum number Nmax in binary comparator 62. The contents of address storage 59 are displayed through a so-called interface 630 by an indicator 63, for example a cathode-ray tube (CRT). The output of (analog) preamplifiers 51 are further applied to an analog selector switch 64 which can be switched through a connecting line 641 (channel select address) to obtain at the output 642 of analog selector switch 64, the analog RF signal present in a certain individual channel, for further testing.

The arrangement described in the foregoing has the following advantages: In addition to a single-channel analog evaluation (output 642) of an RF signal to be tested, a general information (alarm line 551) and a channel-oriented detail information with an associated address (address storage 59), on a frequency band to be tested, are made possible, with the option of cutting out RF pulse amplitudes which might be desirable (sensitivity setting at the adjustable voltage source 54).

The section for working out the digital information described in the foregoing, including the operation of (analog) comparators 53 and address storage 59, operate very rapidly so that in the course of a signal seeking cycle taking some microseconds, the entire frequency band B to be tested can be analyzed generally as well as closely. This ensures a quick monitoring of the frequency band, with a 100% pickup chance. If the binary information in this storage 59 is used for addressing (through 641) the individual (analog) frequency channels of interest, the above described registering arrangement changes into an interactive arrangement. Such a further development is described in the following with reference to FIG. 3.

In addition to the circuitry of FIG. 2, FIG. 3 shows an address processor 65 permitting the selection in advance of certain (frequency) channel groups having channel numbers N2-N1, or individual frequency channels (N2=N1), through a programmable channel counter 60. The binary comparator 62 which is programmable through address processor 65, determines a channel group limit in channel counter 60, for example the channel number N2. Address processor 65 does not work up the active (channel) addresses in address storage 59 cyclically, but in accordance with an information file 601 of a main computer 66. In this information file 601, the properties, such as transmitter power, of known (frequency) channels are stored. Also, new data may be stored in information file 601 through main computer 66. In this way, (frequency) channels of particular interest can be handled preferentially. If, for example, a certain address (channel number) is selected in address processor 65, and if an RF pulse appears in this channel, a store instruction is produced which is based solely on the (frequency) channel selected by the selector switch 64 through connecting line 641 (channel select address). The store instruction is supplied through a connecting line 581 to a sample hold circuit 67 by which an analog sample is taken from the selected channel simultaneously with the store instruction, which is then converted, in a following analog-to-digital converter 68, into a binary word. This binary word corresponds to the analog value of the RF pulse power at the instant of the analog sample taking.

The occurrence in time of the store instruction is a measure of the so-called real-time occurrence of an RF pulse to be tested. If a plurality of RF pulses occur in a (frequency) channel in time sequence, the time interval between the stored instructions thereby produced is a measure of the RF pulse repetition intervals to be determined. All the data determined, for example repetition period and channel address, are initially processed in a signal processor 69, then stored in data storages 691, 692, 693, and displayed by a display 70 which also collects information from main computer 66. Advantageously, the described arrangement may be operated in a so-called stand-by mode and activated only if an alarm signal arrives at main comouter 66 through alarm device 551.

In another embodiment (not shown) an RF pulse signal to be tested is initially supplied to an RF mixer, to which also a frequency oscillator is connected in which the frequency is commutated continuously in time. This makes it possible to monitor a wide frequency band continuously in time. The output signal of the RF mixer, designated as baseband, is supplied to the transmitter 21 shown in FIG. 1. If an RF pulse appears in a frequency band monitored in this way, the frequency oscillator can be prevented through alarm 551 (FIG. 3) from switching over, and the RF signal can exactly be analyzed by means of the arrangement of FIG. 3.

While specific embodiments of the invention have been shown and described in detail to illustrate the application of the principles of the invention, it will be understood that the invention may be embodied otherwise without departing from such principles.

What is claimed is:

1. An arrangement for evaluating a light beam comprising a source of coherent light for generating an input light beam, a Bragg-cell for receiving the input light beam and transmitting an output light beam, signal means connected to said Bragg-cell for applying a signal to said Bragg-cell to oscillate said Bragg-cell and thus oscillate said output light beam, a plurality of lightwave guides each having an entrance gate coupled to said Bragg-cell for receiving said output light beam and an exit gate, a photodetector optically coupled to each lightwave guide exit gate, and an evaluating unit connected to each photodetector for receiving a signal therefrom corresponding to oscillations of said output light beam past each photodetector, and evaluating said photodetector signal, said plurality of light wave guides each having closely spaced entrance gates, and said exit gates being spaced further apart than the spacing between said entrance gates, said signal means connected to said Bragg-cell being adapted to provide an RF signal to said Bragg-cell, said evaluating unit including an alarm device connected to an output of each of said photodetectors for detecting the presence of at least one RF signal from at least one of said photodetectors, said alarm device having an output for supplying said at least one RF signal.

2. An arrangement according to claim 1, wherein each of said entrance gates are disposed in a line for receiving an output light beam from said Bragg-cell.

3. An arrangement according to claim 1, wherein each lightwave guide is polygonal in cross-section.

4. An arrangement according to claim 1, wherein each lightwave guide is provided with an opaque layer on a circumferential surface thereof at least in the vicinity of said entrance gate.

5. An arrangement according to claim 1, including an opaque partition defined between adjacent lightwave guides at least in the vicinity of said entrance gates to prevent optical coupling between adjacent lightwave guides.

6. An arrangement according to claim 1, wherein each photodetector is provided to have an electrical response time in the microsecond range.

7. An arrangement according to claim 1, wherein said evaluating unit receives signals from each of said photodetectors, and has means for one of parallel and demultiplex evaluation of the electrical signals from said photodetectors.

8. An arrangement according to claim 1, wherein said alarm device produces an alarm signal upon detecting the presence of an RF signal from any one of said photodetectors.

9. An arrangement according to claim 1, wherein said evaluating unit includes an electronically computable selector switch connected to each of said photodetectors for receiving a signal from each of said photodetectors and for selectively outputting an RF signal from a selected one of said photodetectors.

10. An arrangement according to claim 1, wherein said evaluating unit includes a data processing device connected to each of said photodetectors for assigning addresses to each of said photodetectors and storing a signal from each of said photodetectors in conjunction with an address assigned to each of said photodetectors.

11. An arrangement according to claim 1, wherein said evaluating unit includes at least one frequency mixer and at least one oscillator for producing a continuous oscillation, said frequency mixer connected to each of said photodetectors for receiving a signal therefrom and for converting an RF signal from one of said photodetectors to be tested to a substantially fixed frequency base band which is adapted to be supplied to said signal means connected to said Bragg-cell, said signal means comprising a transducer.

12. An arrangement according to claim 1, wherein said evaluating unit includes a preamp connected to each of said photodetectors, a computer controllable selector switch connected to an output of each of said preamps, a comparator connected to an output of each of said preamps, reference voltage means connected to an input of each of said comparators for comprising a signal from each of said preamps with said reference voltage, said alarm device comprising an OR gate connected to an output of each of said comparators, a flip-flop connected to an output of each of said comparators, each flip-flop having an output for supplying a first signal upon the reception of a signal from each comparator representing the presence of an RF signal in each photodetector respectively, an AND gate connected to an output of each flip-flop, and addressing means connected to each AND gate for assigning an address for signals from each of said AND gates.

* * * * *